(12) United States Patent
Kato

(10) Patent No.: US 7,772,567 B2
(45) Date of Patent: Aug. 10, 2010

(54) SPECIMEN HOLDING DEVICE AND CHARGED PARTICLE BEAM DEVICE

(75) Inventor: Susumu Kato, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 124 days.

(21) Appl. No.: 11/699,066

(22) Filed: Jan. 29, 2007

(65) Prior Publication Data

US 2007/0210261 A1 Sep. 13, 2007

(30) Foreign Application Priority Data

Feb. 24, 2006 (JP) ............................. 2006-047672

(51) Int. Cl.
*G01F 23/00* (2006.01)
*G21K 5/08* (2006.01)
*G21K 5/10* (2006.01)

(52) U.S. Cl. ...................... 250/442.11; 250/440.11

(58) Field of Classification Search ........... 250/440.11, 250/442.11, 311, 310, 309, 306, 307, 492.22; 269/50, 55, 58; 324/500, 501
See application file for complete search history.

(56) References Cited

U.S. PATENT DOCUMENTS

| 4,733,091 A * | 3/1988 | Robinson et al. ........ 250/442.11 |
| 5,502,306 A | 3/1996 | Meisburger et al. |
| 6,903,338 B2 | 6/2005 | Mankos et al. |
| 2003/0111616 A1* | 6/2003 | Suzuki et al. .......... 250/442.11 |
| 2005/0045821 A1* | 3/2005 | Noji et al. .................... 250/311 |

FOREIGN PATENT DOCUMENTS

| JP | 2-142045 A | 5/1990 |
| JP | 5-258703 A | 10/1993 |
| JP | 2000-149845 A | 5/2000 |

* cited by examiner

*Primary Examiner*—Robert Kim
*Assistant Examiner*—Brooke Purinton
(74) *Attorney, Agent, or Firm*—McDermott Will & Emery LLP

(57) ABSTRACT

A specimen holding device has a plurality of electrodes, and a moving mechanism for moving upward and downward a part of the plurality of electrodes. Further, the moving mechanism moves the part of the plurality of electrodes downward to evacuate from a path through which a specimen is introduced. Further, the specimen holding device has a positioning member for the specimen so that the specimen is positioned after being mounted.

12 Claims, 5 Drawing Sheets

FIG.4
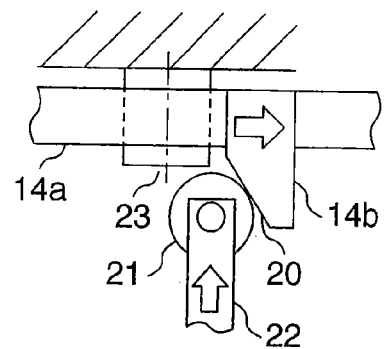
FIG.5
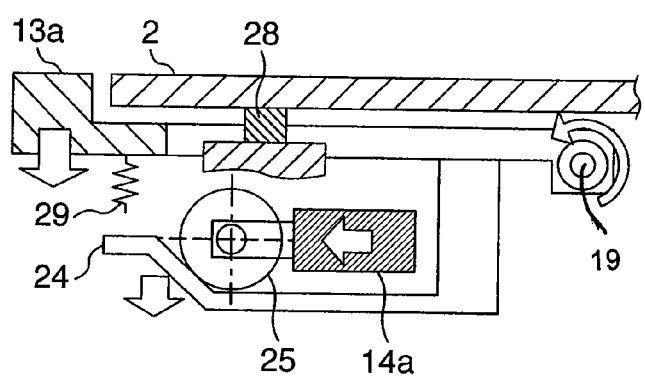
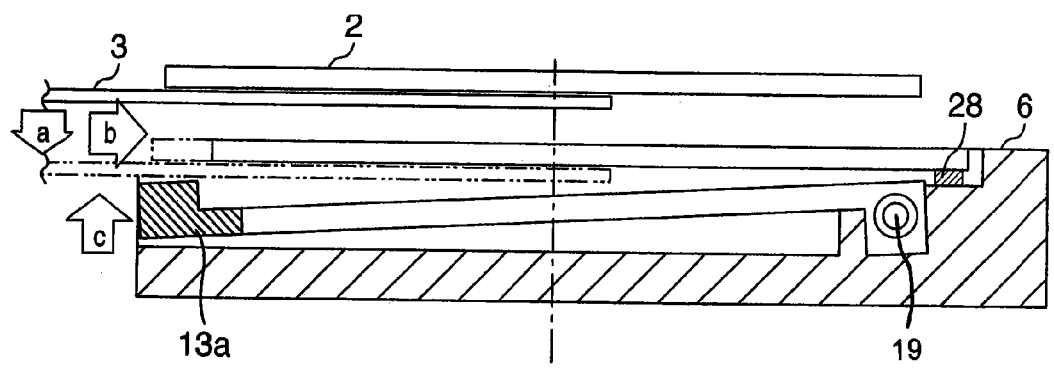

SPECIMEN HOLDING DEVICE AND CHARGED PARTICLE BEAM DEVICE

BACKGROUND OF THE INVENTION

The present invention relates to a holding device for a specimen, mainly a wafer, and a charged particle beam device.

A device for treating a semiconductor wafer with a charged particle beam or a device for inspecting a circuit pattern on the semiconductor wafer with the charged particle beam, has a device for holding the semiconductor wafer as a work piece or an object to be inspected.

As an example of such device, an electron beam measuring apparatus is known. It measures width and position of the circuit pattern formed on the semiconductor wafer with the electron beam as the charged particle beam, and has an electron beam probe, an image processor, a specimen stage and so forth. In the electron beam measuring apparatus, an intensity of emitted energy of the electron beam is adjusted by applying a voltage to the semiconductor wafer so that the width and position of the circuit pattern are measured with a desired accuracy and resolving power while preventing an element of the circuit pattern from being damaged by the electron beam. This voltage application is called as retarding. Such technique is disclosed by, for example, JP-A-2-142045 and JP-A-5-258703 (U.S. Pat. No. 5,502,306).

As a method for making an electric field generated over the semiconductor wafer constant to decrease a beam shift, a method in which an electrode is arranged on an outer periphery of the wafer to make the electric field constant, is known. The electrode is an electrically conductive plate having the same height as a surface of the wafer with a small clearance with respect to the wafer. An effect of the electrode for making the electric field constant is described in detail by JP-A-2000-149845.

BRIEF SUMMARY OF THE INVENTION

An object of the present invention is that in a device for holding a specimen, mainly a wafer while making an electrical field constant with an electrode, a moving path for the wafer and a region through which the wafer is capable of being mounted before being positioned are kept large while preventing a chamber volume and an escape stroke from being increased.

According to the invention, a device for holding a specimen, mainly a wafer, comprises a plurality of electrodes and is characterized by a moving mechanism for moving upward and downward a part of the electrodes. Further, the moving mechanism is characterized by that the moving mechanism moves the part of the electrodes downward to be separated from a path for introducing the specimen. Further, the device for holding the specimen has a member for positioning the specimen to be characterized by that the specimen is positioned after the specimen is mounted.

According to the invention, when the specimen is mounted on the device for holding the specimen with the electrodes for applying a negative voltage, the moving path for the wafer and the region through which the wafer is capable of being mounted before being positioned are kept large.

Further, according to the invention, since the electrodes are moved downward so that the specimen is exchanged, an upward and downward movement of the specimen is not necessary.

The other object, distinctive feature and advantage will be understood from a description of embodiments of the invention relating to attached drawings.

BRIEF DESCRIPTION OF THE DRAWINGS

FIG. 4 is a view as seen in a direction of an arrow A in FIG. 3.
FIG. 5 is a cross sectional view along B-B in FIG. 3.
FIG. 6 is a cross sectional view along C-C in FIG. 3.

DETAILED DESCRIPTION OF THE INVENTION

Figure 1:
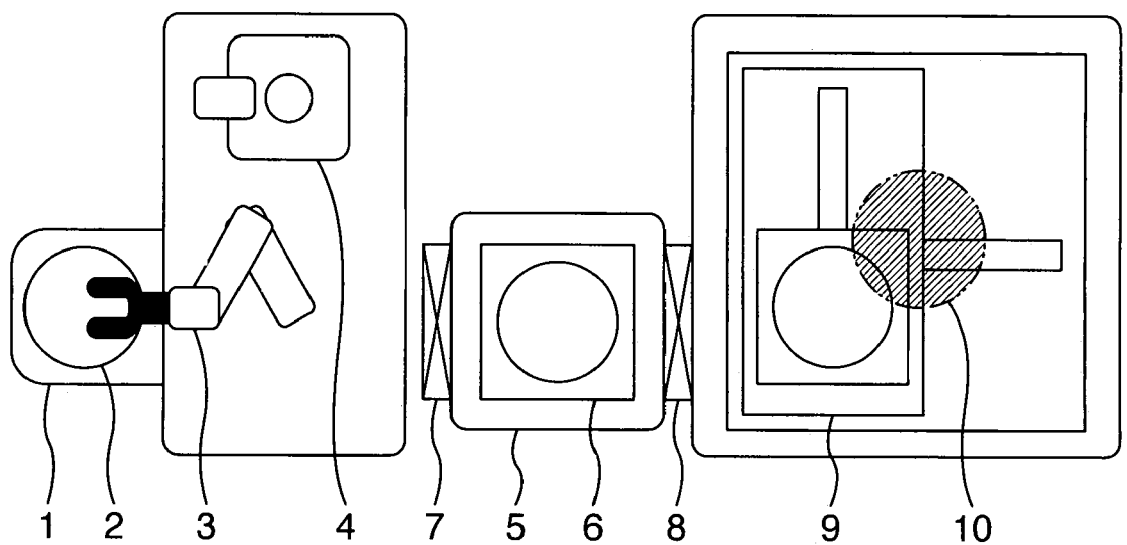
FIG. 1 is a brief view of a scanning electron microscope.

In FIG. 1, a structure of a scanning electron microscope as an example, is shown briefly. A specimen is a wafer.

At first, a transfer robot 3 removes the wafer 2 from a carrier 1 to mount the wafer 2 onto an aligner 4. The aligner 4 sets an alignment of the wafer. In this time, a holder 6 with a specimen holding device exists in a load lock chamber 5. After setting the alignment, the transfer robot 3 transfers the wafer 2 from the aligner 4 into the load lock chamber 5 so that the wafer is mounted onto the holder 6. After mounting the wafer, a gate valve 7 of the load lock chamber 5 is closed to be vacuumized. After becoming vacuum, a gate valve 8 at a specimen chamber side is opened and the holder is transferred onto a stage 9 so that the wafer is completely received by a measuring environment.

Next, the stage is moved so that a pattern on the wafer to be measured is positioned below an electronic optical system 10. After the stage 9 stops, an electron beam is emitted toward the wafer to which a retarding voltage is applied. A position of the stage 9 is measured by a laser interferometer so that its movement is controlled in accordance with the measured positional information.

The electron beam proceeds into the specimen so that the wafer 2 emits secondary electron. The emitted secondary electron is introduced into a detector to be detected. A length and so forth of the pattern are measured from the detected secondary electron.

After a predetermined sequence of measurements for the wafer is completed, the holder 6 is transferred into the load lock chamber 5 and the wafer 2 is transferred onto the carrier 1 to take out the wafer in an order reversed with respect to the previous order.

Embodiment 1

A first embodiment of the invention is shown in FIGS. 2-8. An example thereof is a scanning electron microscope for measuring a pattern on a wafer. A specimen is the wafer.

Figure 2:
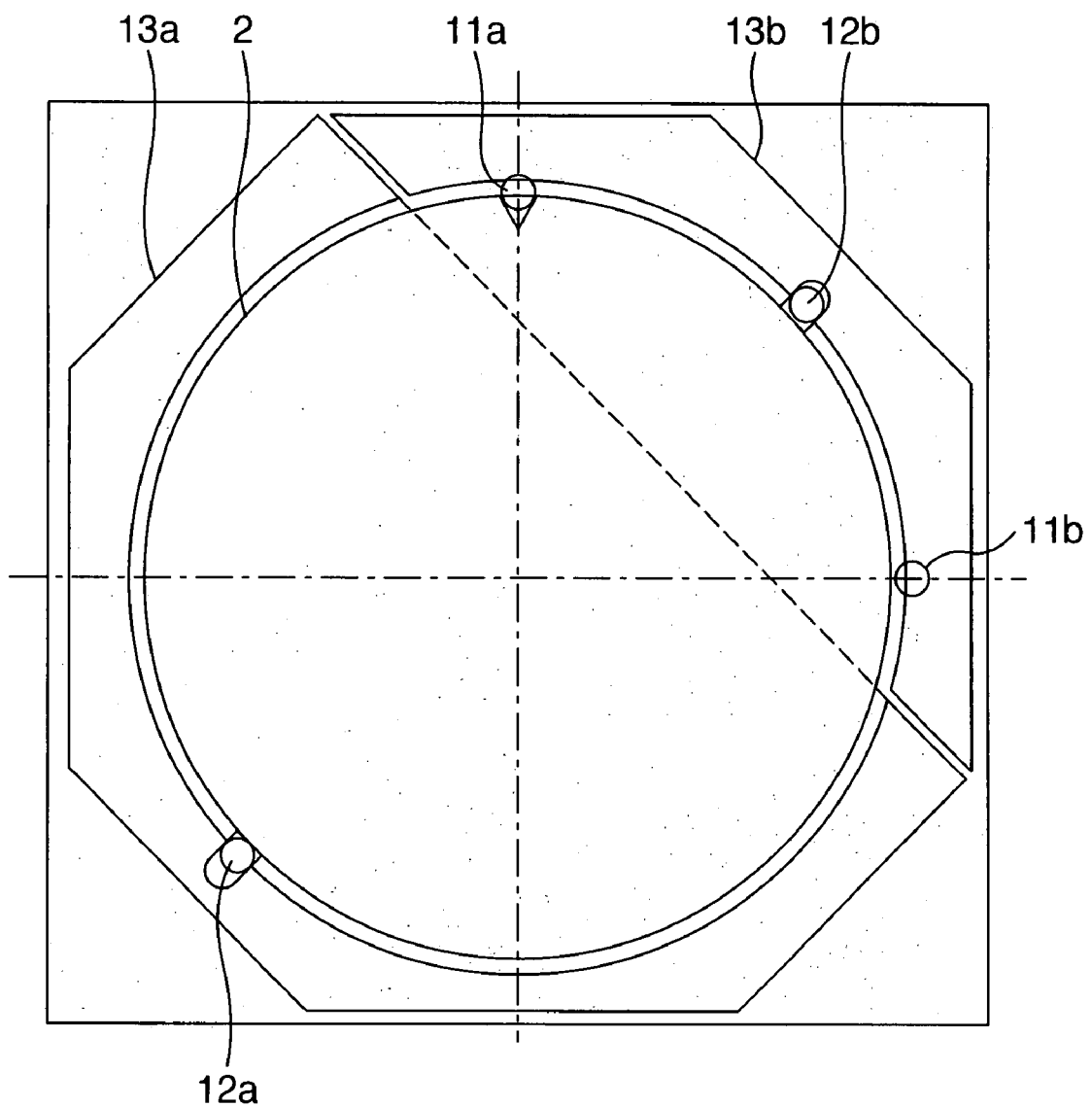
FIG. 2 is a plan view of a specimen holding device as seen from an upper position.
Figure 3:
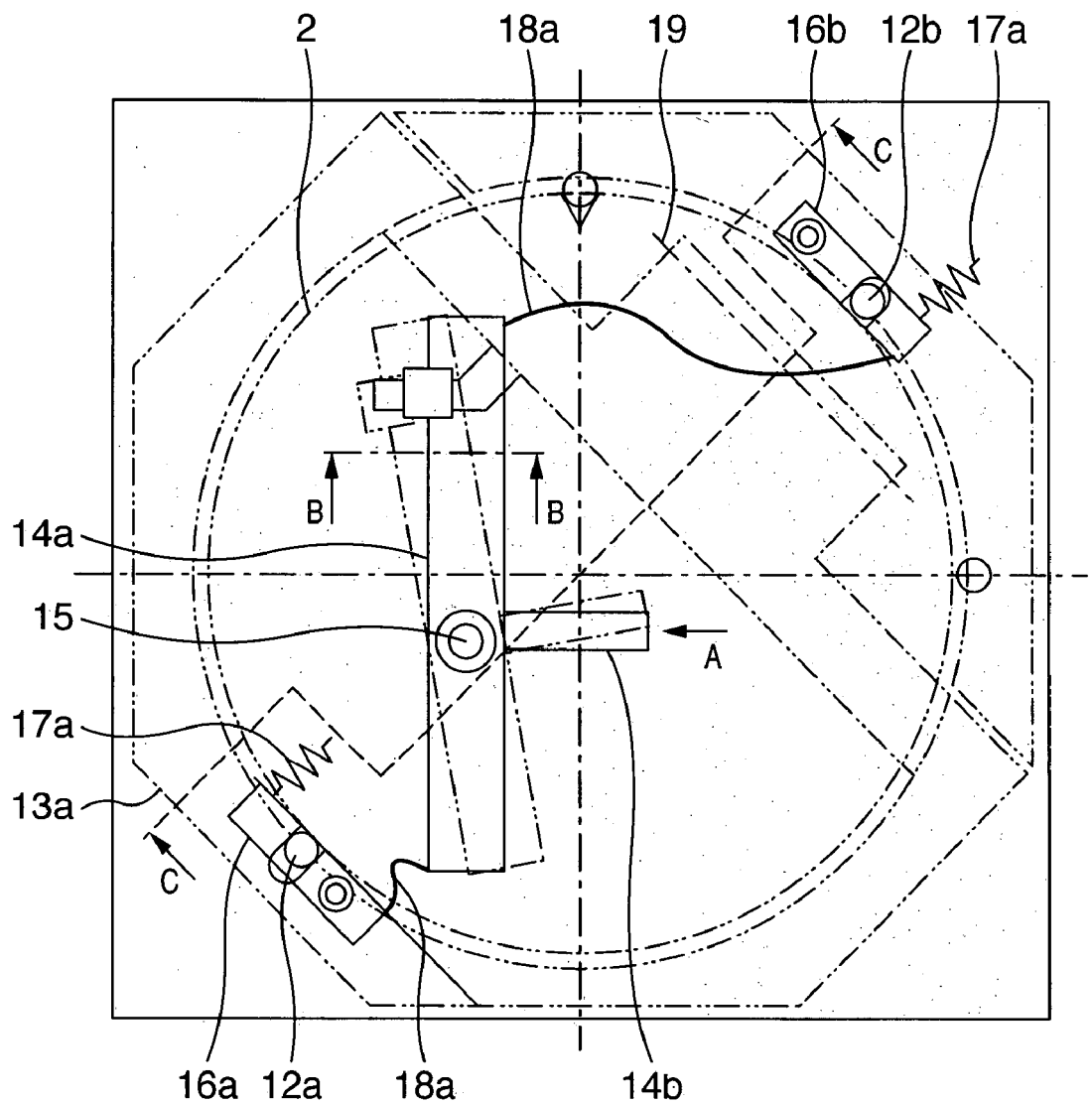
FIG. 3 is a perspective view showing an inner mechanism of the specimen holding device.

FIG. 2 is a plan view of a specimen holding device as seen from an upper position. FIG. 3 is a perspective view showing an inner mechanism of the specimen holding device of FIG. 2. FIG. 4 is a view as seen in a direction of an arrow A in FIG. 3, FIG. 5 is a cross sectional view along B-B in FIG. 3, FIGS. 6 and 7 are cross sectional views along C-C in FIG. 3, and FIG. 8 is a sequential flow chart.

Figure 7:
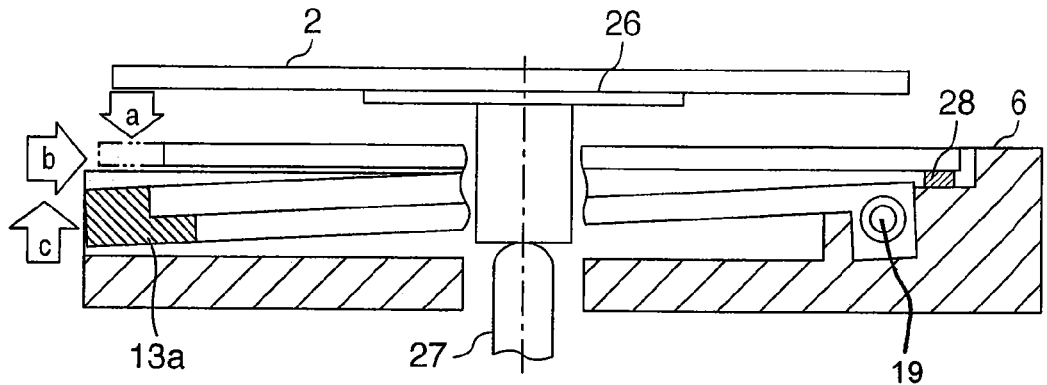
FIG. 7 is a cross sectional view along C-C in FIG. 3.
Figure 8:
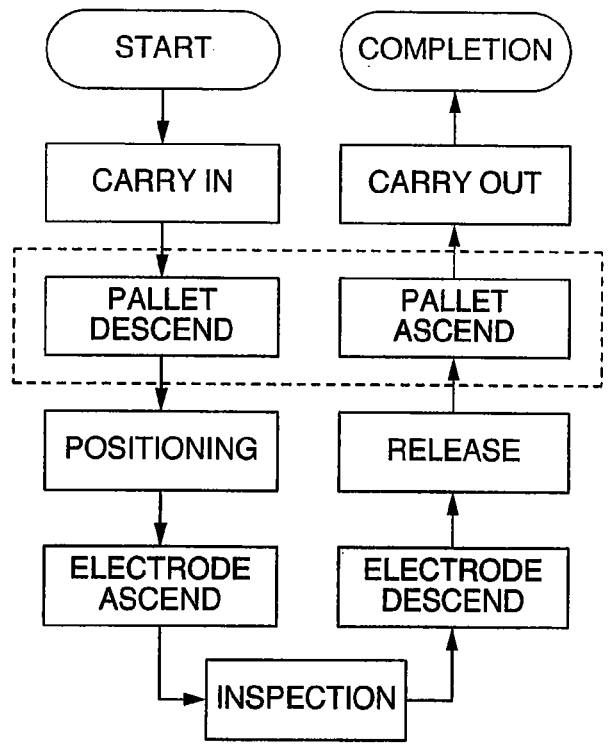
FIG. 8 is a sequential flow chart.

The wafer 2 is held by two fixing pins 11a, 11b, a movable chuck pin 12a as shown in FIG. 2 and a support base 28 as shown in FIGS. 5-7.

An electric field uniformizing electrode has a movable electrode 13a and a stationary electrode 13b to surround the wafer with a clearance of not more than 0.5 mm. It is optimum that the electric field uniformizing electrode has the same height as the wafer, but a difference of not more than 200 micrometers caused by an error in machining and assembling is acceptable.

The movable electrode 13a descends to be prevented from interfering with the wafer 2 when the wafer 2 is moved toward the movable chuck pin 12a. For preventing the wafer from interfering with the stationary electrode 13b, the stationary electrode 13b needs to surround not more than a half of an outer periphery of the wafer. In other words, the movable electrode 13a needs to surround not less than the half of the outer periphery of the wafer.

Incidentally, the movable electrode surrounding not less than the half of the outer periphery of the wafer may be divided to a plurality of parts.

In FIG. 3, the movable chuck pin 12a is of a lever type. A pull spring 17a is attached to a lever 16a to support the wafer with a tension of the pull spring. On the other hand, a movable unchuck pin 12b is also of the lever type. A pull spring 17b is attached thereto so that this pull spring pulls the movable unchuck pin to be separated from the wafer 2. Incidentally, a spring force is preferably as small as possible while being sufficient for keeping the movable unchuck pin 12b separated from the wafer 2.

The movable unchuck pin 12b is preferably arranged at a position substantially symmetrical about a point with respect to the movable chuck pin 12a. The movable unchuck pin 12b separates the wafer from the fixing pins 11a, 11b by about 0.5 mm after the electrode descends to unload the wafer. Therefore, when the wafer 2 is lifted, the wafer 2 is prevented from sliding on the fixing pins 11a, 11b to cause a contamination. For this reason, when the wafer is chucked, the movable unchuck pin 12b may be separated from the wafer 2.

A main lever 14a rotates on a shaft 15 by some degrees. The main lever 14a has an input lever 14b. As described below, an actuator arranged in the load lock chamber 5 presses through a rod 22 the input lever 14b to be actuated.

A relationship between the main lever 14a and each of the chuck pins 12a and 12b is set so that each of the chuck pins 12a and 12b is kept stationary for a time after the main lever is actuated, and each of the chuck pins 12a and 12b is moved completely when the actuation of the main lever 14a is completed. For example, as in the embodiment, opposite ends of the main lever 14a are connected to a lever 16a of the movable chuck pin and a lever 16b of the movable unchuck pin respectively through respective wires 18a and 18b having respective preferable plays to obtain the relationship.

The movable electrode 13a rotates on a shaft 19 substantially perpendicular to a line passing the movable chuck pin 12a and a center of the wafer 12 and parallel to a surface of the wafer so that the movable electrode 13a ascends and descends.

With making reference to FIG. 4, a method for driving the main lever 14a is described. The input lever 14b of the main lever 14a has a tapered portion 20. A rod 22 having a roller 21 at its front end is pushed upward by an actuator arranged at a lower side of the load lock chamber. The roller 21 at the front end of the rod 22 presses the tapered portion 20 of the input lever 14b to drive rotationally the main lever 14a on the shaft 23 through the input lever 14b. When the rod is pressed upward, an introducing situation is kept.

In FIG. 5, the movable electrode 13a is normally kept at an upper position by a push spring 29. The movable electrode 13a has a down lever 24. The main lever 14a has a roller 25 so that a rotation of the main lever 14a causes a descent of the movable electrode 13a.

The movable electrode 13a needs to descend completely before each of the chuck pin 12a and 12b starts to move. Therefore, the main lever 14a needs to be driven until the movement of each of the chuck pin 12a and 12b is finished after the movable electrode 13a descends sufficiently, and this operation is achieved by a spring characteristic of the down lever 24.

As described above, by the mechanism described with making reference to FIGS. 2-5, the movable chuck pin 12a, the movable unchuck pin 12b and the movable electrode 13a are driven in order by a small input movement. That is, when the main lever 14 is actuated, each of the chuck pins 12a and 12b moves after the movable electrode descends. On the other hand, when the main lever is released from being actuated, the movable electrode 13a ascends after each of the chuck pins 12a and 12b moves so that the movable chuck pin 12a positions the wafer 2.

Incidentally, the main lever 14a and the down lever 24 may have respective actuators to be controlled independent of each other.

With making reference to FIGS. 6-8, a handling of the wafer from the loading to the positioning is explained.

Since a mechanism for bringing up and down the wafer such as a hoisting palette is not requisite in the invention, a case where the hoisting palette is not used is explained firstly.

The arm of the transfer robot 3 transfers the wafer 2 into the load lock chamber 5. In this time, the actuator 27 actuates the main arm 14a of the specimen holding device to move the movable electrode 13a downward as shown in FIG. 6 and to keep the movable chuck pin at an evacuated position. Incidentally, the movable electrode 13a is kept at a height for prevented from interfering with the arm when the arm of the transfer robot 3 descends in a direction shown by an arrow mark a.

The arm of the transfer robot 3 descends in the direction shown by the arrow mark a to mount the holder on the support base 28 of the holder 6. In this time, the wafer 2 is positioned at a substantially intermediate position among the fixing pins 11a and 11b and the movable chuck pin 12a.

After the arm of the transfer robot 3 descends to be evacuated, the main lever 14a is prevented from being actuated to move the wafer with the movable chuck pin 12a in a direction shown by an arrow mark b to be positioned, and subsequently the movable electrodes 13a ascends in a direction as shown by an arrow mark c to complete the loading.

When the wafer 2 is unloaded, the main lever 14a is actuated in a reversed order.

Next, a case where the hoisting palette is used is explained. In FIG. 7, the wafer transferred into the load lock chamber 5 by the transfer robot 3 is arranged on the hoisting palette 26 of the holder 6 with the specimen holding device. The hoisting palette 26 is kept at an elevated position by an actuator 27 arranged on the load lock chamber 5. Further, the actuator actuates the main lever 14a of the specimen holding device to bring the movable electrode 13a downward and keep the movable chuck pin 12a at the evacuated position. The movable electrode 13a descends to a position for being prevented from interfering with the wafer. After the arm of the transfer robot 3 moves out of the load lock chamber 5, the actuator 27 moves downward the palette 26 in the direction shown by the arrow mark a to mount the wafer on the support base 28 of the holder 6. In this time, the wafer 2 is positioned at the substantially intermediate position among the fixing pins 11a and 11b and the movable chuck pin 12a.

Just after the palette 26 descends, the main lever 14a is prevented from being actuated so that the movable chuck pin 12a moves the wafer in the direction shown by the arrow mark b to be positioned, and subsequently the movable electrode 13a ascends in the direction shown by the arrow mark c to complete the loading.

When the wafer 2 is unloaded, the main lever 14a and the palette 26 are actuated in the reversed order.

Finally, FIG. 8 shows a flow chart of the transfer sequence. In FIG. 8, operations surrounded by a broken line is cancelled when the hoisting palette is not used so that a through put is improved.

Embodiment 2

A second embodiment of the invention is shown. In this embodiment, an electrostatic attraction is used for holding the specimen. In this case, the specimen is wafer.

A basic structure may include the structure of the embodiment 1 as shown in FIGS. 2-6, and an electrostatic chuck is used as a substitute for the support base 28, or is incorporated in a region prevented from interfering with the wafer hoisting palette 26.

Although the fixing pins 11a and 11b and the movable chuck pin 12a are used to position and support the specimen in the embodiment 1, the fixing pins 11a and 11b and the movable chuck pin 12a are used to position the wafer and the specimen is supported by the electrostatic chuck in the embodiment 2. Since the fixing pins 11a and 11b and the movable chuck pin 12a are used mainly to position the wafer, the tension of the pull spring for the movable chuck pin 12a may be decreased to a force sufficient for positioning the wafer.

Further, since the wafer is supported by the electrostatic chuck in the embodiment 2, the fixing pins 11a and 11b and the movable chuck pin 12a may be tapered toward front ends thereof in their respective cross sections. Therefore, a provability of that dust is formed by friction between the pins 11a, 11b and 12a and the wafer ascending is decreased so that the movable unchuck pin 12b becomes unnecessary for the holding device.

The above description is based on the embodiments, but it is clear for the ordinary skilled in the art that the invention does not need to be limited to the embodiments, and may be variously changed or modified within the essence of the invention and the scope of attached claims.

The invention claimed is:

1. A scanning electron microscope comprising:
an electron source;
a negative voltage applying electric source for applying a negative voltage to a specimen;
a specimen supporting device for supporting the specimen at a supporting position;
a specimen introducing mechanism for introducing the specimen along a moving direction of the specimen;
a movable electrode and a stationary electrode arranged to surround a periphery of a surface of the specimen so that the negative voltage is applied to reduce nonuniformity in an electric field at the periphery of the surface of the specimen wherein a length of a part of the periphery facing the movable electrode is greater than a length of a part of the periphery facing the stationary electrode;
and a moving mechanism for moving the movable electrode downward so that the movable electrode evacuates from a path through which the specimen is introduced, wherein:
the moving mechanism has a rotational axis on which the part moving electrode is rotatable to be movable vertically, and
the rotational axis is parallel to the surface of the specimen and distant from movable electrode, and extends through the stationary electrode.

2. The specimen holding device according to claim 1, wherein the movable electrode is rotatable on a predetermined axis parallel to a surface of a wafer to move upward and downward.

3. The specimen holding device according to claim 1, further comprising a hoisting mechanism.

4. The scanning electron microscope according to claim 1, wherein the rotational axis passes two points on the part of the periphery facing the stationary electrode distant from each other in a circumferential direction of the surface.

5. The scanning electron microscope according to claim 1, wherein in a direction perpendicular to the surface, the rotational axis and the surface overlap.

6. A specimen holding device comprising a specimen supporting part for supporting a specimen, and a negative voltage applying electrode arranged to surround a side of the specimen,
wherein the negative voltage applying electrode of the specimen holding device has a movable electrode and a stationary electrode to reduce nonuniformity in an electric field at a periphery of a surface of the specimen, and the device has a moving mechanism for the movable electrode downward to evacuate from an extension line of the specimen,
wherein a length of a part of the periphery facing the movable electrode is greater than a length of a part of the periphery facing the stationary electrode,
wherein the moving mechanism has a rotational axis on which moving electrode is rotatable to be movable vertically,
and wherein the rotational axis is parallel to the surface of the specimen and distant from the movable electrode, and extends through the stationary electrode.

7. The specimen holding device according to claim 6, wherein the rotational axis passes two points on the part of the periphery facing the stationary electrode distant from each other in a circumferential direction of the surface.

8. The specimen holding device according to claim 6, wherein in a direction perpendicular to the surface, the rotational axis and the surface overlap.

9. A specimen holding device for receiving a specimen from a transfer member and holding the specimen so that a voltage is applied to the specimen, comprising,
a support surface contactable with the specimen to receive the specimen from the transfer member and to support the specimen in a thickness direction of the specimen,
at least two positioning surfaces being arranged distantly from each other as seen in the thickness direction of the specimen and contactable with the specimen so that the specimen supported on the support surface is positioned in a radial direction of the specimen perpendicular to the thickness direction of the specimen,
a pressing member movable between a first position at which the pressing member contacts the specimen to be pressed against the at least two positioning surfaces when the specimen is supported on the support surface and a second position arranged at a radially outer side with respect to the first position as seen in the thickness direction of the specimen so that the pressing member is prevented from pressing the specimen against the at least two positioning surfaces, and an electrode capable of facing closely to the specimen in the radial direction of the specimen and surrounding the specimen as seen in the thickness direction of the specimen to apply the voltage to the specimen when the specimen is supported on the support surface and pressed against the at least two positioning surfaces by the pressing member, wherein the electrode has first and second parts, and as seen in the thickness direction of the specimen, the at least two positioning surfaces are adjacent to the first part in the radial direction of the specimen so that the specimen is prevented from moving radially outward to contact the first part while the pressing member is adjacent to the second part in the radial direction of the specimen so that the specimen is prevented from moving radially outward to contact the second part, and the second part is movable with respect to the first part in the thickness direction of the specimen so that a height of the second part with respect to the support surface when the pressing member is at the second position is lower than a height of the second part with respect to the support surface when the pressing member is at the first position.

10. The specimen holding device according to claim 9, wherein the first part has a first circumferential electrode length facing closely to the specimen in the radial direction, the second part has a second circumferential electrode length facing closely to the specimen in the radial direction, a total of the first and second circumferential electrode lengths surrounds an outer periphery of the specimen as seen in the thickness direction of the specimen, and the second circumferential electrode length is longer than the first circumferential electrode length.

11. The specimen holding device according to claim 9, wherein the at least two positioning surfaces and the pressing member are electrically insulative.

12. A specimen holding device for receiving a specimen from a transfer member and holding the specimen so that a voltage is applied to the specimen, comprising, a support surface contactable with the specimen to receive the specimen from the transfer member and to support the specimen in a thickness direction of the specimen, at least two positioning surfaces being arranged distantly from each other as seen in the thickness direction of the specimen and contactable with the specimen so that the specimen supported on the support surface is positioned in a radial direction of the specimen perpendicular to the thickness direction of the specimen, a pressing member movable between a first position at which the pressing member contacts the specimen to be pressed against the at least two positioning surfaces when the specimen is supported on the support surface and a second position arranged at a radially outer side with respect to the first position as seen in the thickness direction of the specimen so that the pressing member is prevented from pressing the specimen against the at least two positioning surfaces, and an electrode capable of facing closely to the specimen in the radial direction of the specimen and surrounding the specimen as seen in the thickness direction of the specimen to apply the voltage to the specimen when the specimen is supported on the support surface and contacts the at least two positioning surfaces to be positioned, wherein the electrode has first and second parts, and as seen in the thickness direction of the specimen, the at least two positioning surfaces are adjacent to the first part in the radial direction of the specimen so that the specimen is prevented from moving radially outward to contact the first part while the pressing member is adjacent to the second part in the radial direction of the specimen so that the specimen is prevented from moving radially outward to contact the second part, and the second part is movable with respect to the support surface in the thickness direction of the specimen so that a height of the second part with respect to the support surface when the pressing member is at the second position is lower than a height of the second part with respect to the support surface when the pressing member is at the first position.

* * * * *